US006492709B2

(12) United States Patent
Olson

(10) Patent No.: US 6,492,709 B2
(45) Date of Patent: Dec. 10, 2002

(54) ARRANGEMENT FOR COMPENSATING FOR TEMPERATURE DEPENDENT VARIATIONS IN SURFACE RESISTANCE OF A RESISTOR ON A CHIP

(75) Inventor: Allan Olson, Spånga (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 8 days.

(21) Appl. No.: 09/861,773

(22) Filed: May 22, 2001

(65) Prior Publication Data

US 2001/0045881 A1 Nov. 29, 2001

(30) Foreign Application Priority Data

May 26, 2000 (SE) .............................................. 0001981

(51) Int. Cl.[7] ................................................ H01L 29/00

(52) U.S. Cl. ........................ 257/536; 257/467; 257/469; 341/119; 341/154; 338/7; 338/9; 338/13

(58) Field of Search ................................. 257/536, 467, 257/469; 341/119, 154; 338/7, 9, 13

(56) References Cited

U.S. PATENT DOCUMENTS 3,715,609 A 2/1973 Hallen
4,229,753 A 10/1980 Bergeron et al.
4,464,646 A * 8/1984 Burger et al. ................. 338/25
4,591,743 A * 5/1986 Kung ......................... 307/491
4,622,476 A 11/1986 Venkatesh
4,633,230 A * 12/1986 Tam ........................... 340/521
4,647,906 A * 3/1987 Naylor et al. ............... 340/347
4,829,571 A * 5/1989 Kakiuchi et al. ............. 381/25
5,721,487 A * 2/1998 Milosevic ................... 324/207

FOREIGN PATENT DOCUMENTS

EP 826984 * 3/1998

* cited by examiner

*Primary Examiner*—Nathan J. Flynn
*Assistant Examiner*—Ahmed N. Sefer
(74) *Attorney, Agent, or Firm*—Nixon & Vanderhye, P.C.

(57) ABSTRACT

To compensate for temperature dependent variations and process variations in surface resistance of a main resistor (R1) on a chip (1), one or more compensating resistors (R11, R12. . . R1*n*) can be connected in series with the first resistor (R1) via normally open switches (SR11, SR12. . . SR1*n*). The switches are closed to connect one or more of the compensating resistors (R11, R12. . . SR1*n*) in series with the main resistor (R1) in response to whether the voltage across resistors (R21, R22. . . R2*n*) produced on the chip (1) in the same process and proportional to the compensating resistors (R11, R12. . . R1*n*) is higher or lower than a fixed reference voltage (VR3).

1 Claim, 1 Drawing Sheet

ARRANGEMENT FOR COMPENSATING FOR TEMPERATURE DEPENDENT VARIATIONS IN SURFACE RESISTANCE OF A RESISTOR ON A CHIP

TECHNICAL FIELD

The invention relates generally to resistors and more specifically to an arrangement for compensating for temperature dependent variations and process variations in surface resistance of resistors on a chip.

BACKGROUND OF THE INVENTION

When filters are produced on silicon chips, there are a number of factors that influence the transfer function of the filters. Since it is the RC-constant that sets the cut-off frequency of a filter, one can look at what causes the R, i.e. the resistance, and the C, i.e. the capacitance, to change.

The surface resistance of a resistor varies with temperature. Moreover, the surface resistance can vary in response to variations in the production process. The width of the resistor on the chip can e.g. vary.

In total, the resistance value can vary more than ±50%.

The capacitance value varies merely marginally and does not need compensation in the same extent.

SUMMARY OF THE INVENTION

The object of the invention is to provide an arrangement for compensating for such temperature dependent variations and process variations in surface resistance of a resistor on a chip.

This is attained in accordance with the invention by automatically connecting one or more compensating resistors in series with a main resistor.

BRIEF DESCRIPTION OF THE DRAWING

The invention will be described more in detail below with reference to the appended drawing on which the single FIGURE is a schematic illustration of an embodiment of a compensating arrangement for a resistor on a chip in accordance with the invention.

DESCRIPTION OF THE INVENTION

Figure 1:
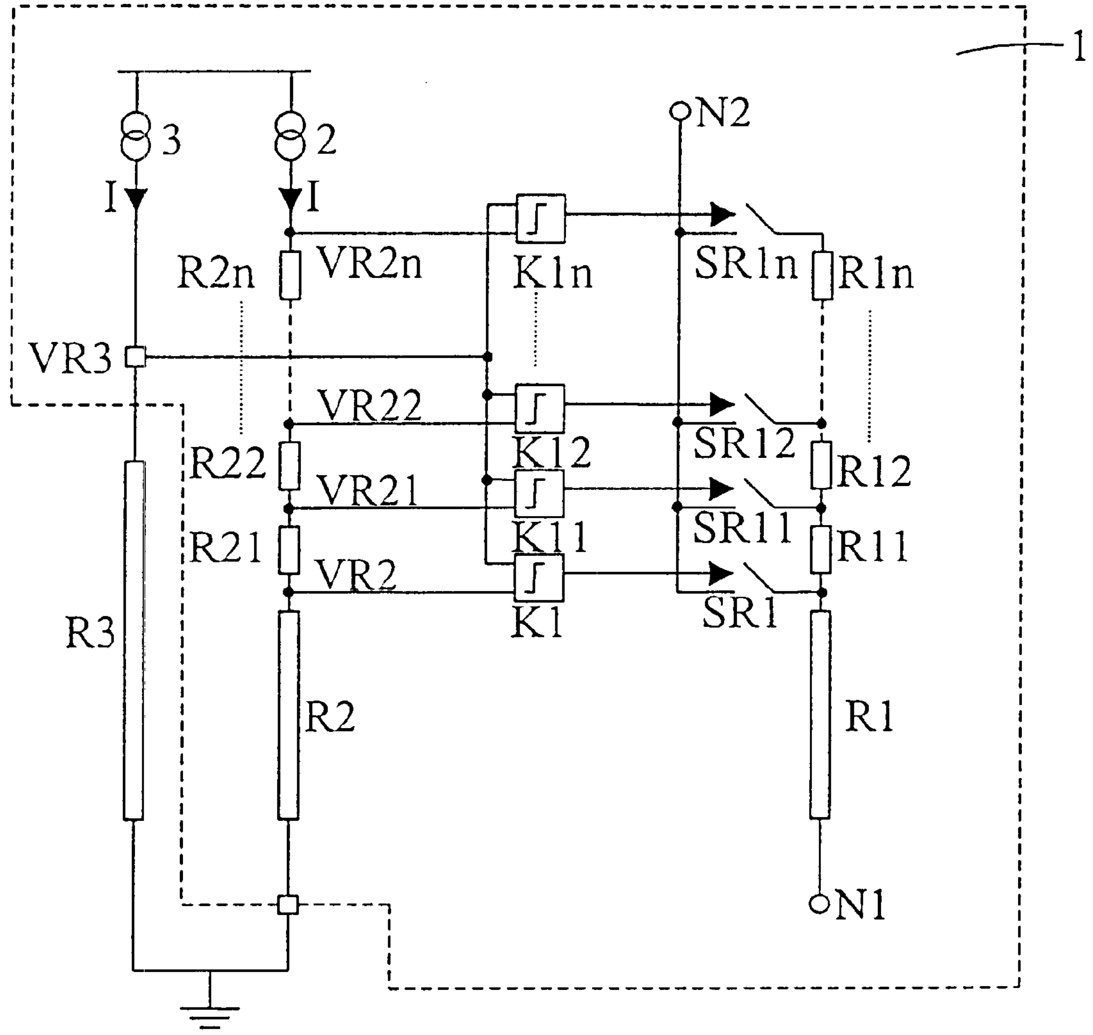

On the drawing, a main resistor R1 on a chip 1 is shown. The resistor R1 can constitute part of a filter circuit (not shown).

In accordance with the invention, to compensate for temperature dependent variations and process variations in surface resistance of the main resistor R1, the resistor R1 can be connected in series with one or more compensating resistors R11, R12 . . . R1*n*.

The main resistor R1 in series with any of the compensating resistors R11, R12 . . . R1*n* is connected between two terminals N1 and N2 on the chip 1.

To determine whether or not the resistor R1 has to be connected in series with any of the compensating resistors R11, R12 . . . R1*n* between the terminals N1 and N2 to compensate for temperature dependent variations and process variations, a resistor R2 proportional to the resistor R1, is connected in series with resistors R21, R22 . . . R2*n* proportional to the compensating resistors R11, R12 . . . R1*n* between a ground terminal and a current generator 2.

The resistors R2, R21, R22 . . . R2*n* are produced on the chip 1 in the same process as the resistors R1, R11, R12 . . . R1*n*.

External to the chip 1, a precision resistor R3 with low temperature coefficient is connected between the ground terminal and a current generator 3. The current generator 3 generates a reference current I through the resistor R3. In accordance with the invention, the current generator 2 generates a current I, that is identical to the reference current I generated by the current generator 3, through the resistor R2 in series with the resistors R21, R22 . . . R2*n*.

Instead of having two separate current generators 2 and 3, the reference current I through the resistor R3 can be mirrored by means of a current mirror (not shown) to flow through the resistor R2 in series with the resistors R21, R22 . . . R2*n*.

In accordance with the invention, the reference current I from the current generator 3 generates a fixed reference voltage VR3 across the external resistor R3.

The current I from the current generator 2 generates a voltage VR2 across the resistor R2, and voltages VR21, VR22 . . . VR2*n* across the respective resistor R21, R22 . . . R2*n*.

The main resistor R1 is connectable to the terminal N2 either directly via a switch SR1 or indirectly in series with one or more of the compensating resistors R11, R12 . . . R1*n* via switches SR11, SR12 . . . SR1*n, respectively.*

The switches SR1, SR11, SR12 . . . SR1*n* are e.g. transistors controlled by output signals from respective comparators K1, K11, K12 . . . K1*n*.

One input of the comparators K1, K11, K12 . . . K1*n* is connected to the interconnection point between the current generator 3 and the resistor R3, and is thus supplied with the fixed reference voltage VR3.

The other input of the comparators K1, K11, K12 . . . K1*n* is connected to the respective interconnection point between the resistors R2, R21, R22 . . . R2*n*, and is thus supplied with the respective voltage VR2, VR21, VR22 . . . VR2*n*.

Thus, the comparator K1 compares the voltage VR2 across the resistor R2 with the fixed reference voltage VR3 across the resistor R3.

If the voltage VR2 is higher than the fixed reference voltage VR3, indicating that the resistance of the main resistor R1 does not have to be compensated for, the comparator K1 outputs an output signal to close the switch SR1 to, hereby, connect the main resistor R1 directly to the terminal N2.

If e.g. the comparator K12 detects that the voltage across the resistor R2 in series with the resistors R21 and R22, i.e. the voltage VR2+VR21+VR22, is higher than the fixed reference voltage VR3, the comparator K12 will output an output signal to close the switch SR12 to connect the resistors R11 and R12 in series with the main resistor R1 to the terminal N2 to compensate for a variation of the surface resistance of the main resistor R1.

In this manner, one or more of the compensating resistors R11, R12 . . . R1*n* can be connected in series with the main resistor R1 to the terminal N2 to compensate for temperature dependent variations and process variations in surface resistance of the main resistor R1 on the chip 1.

What is claimed is:

1. An arrangement for compensating for temperature dependent variations and process variations in surface resistance of a first resistor (R1) on a chip (1), characterized in that said first resistor (R1) is connectable between a first terminal (N1) and a second terminal (N2) directly via a normally open first switch (SR1) and indirectly in series with at least one compensating second resistor (R11, R12 . . . R1_n_) on the chip (1) via a normally open second switch (SR11, SR12 . . . SR1_n_), that a first comparator (K1) is adapted to compare a reference voltage (VR3), generated by a reference current (I) across a precision resistor (R3) external to the chip (1), with a first voltage (VR2) generated by a current identical to the reference current (I) across a third resistor (R2) on the chip (1), proportional to said first resistor (R1), and generate an output signal to close said normally open first switch (SR1) to connect said first resistor (R1) directly to said second terminal (N2) if the reference voltage (VR3) is lower than said first voltage (VR2), and that at least one second comparator (K11, K12 . . . K1_n_) is adapted to compare the fixed reference voltage (VR3) with a second voltage generated by said current identical to the reference current (I) across the third resistor (R2) in series with at least one fourth resistor (R21, R22 . . . R2_n_) on the chip (1), proportional to said at least one compensating second resistor (R11, R12 . . . R1_n_), and generate an output signal to close said normally open second switch (SR11, SR12 . . . SR1_n_) to connect said first resistor (R1) in series with said at least one compensating second resistor (R11, R12 . . . R1_n_) to said second terminal (N2) if the reference voltage (VR3) is lower than the voltage across the third resistor (R2) in series with said at least one fourth resistor (R21, R22 . . . R2_n_).

* * * * *